(12) United States Patent
Hook et al.

(10) Patent No.: US 7,560,345 B2
(45) Date of Patent: Jul. 14, 2009

(54) METHOD OF ASSESSING POTENTIAL FOR CHARGING DAMAGE IN INTEGRATED CIRCUIT DESIGNS AND STRUCTURES FOR PREVENTING CHARGING DAMAGE

(75) Inventors: Terence B. Hook, Jericho, VT (US); Jeffrey Scott Zimmerman, Swanton, VT (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 11/749,775

(22) Filed: May 17, 2007

(65) Prior Publication Data

US 2007/0212799 A1 Sep. 13, 2007

Related U.S. Application Data

(60) Division of application No. 11/275,482, filed on Jan. 9, 2006, which is a continuation-in-part of application No. 11/003,988, filed on Dec. 4, 2004, now Pat. No. 7,132,318, which is a division of application No. 10/605,888, filed on Nov. 4, 2003, now Pat. No. 7,067,886.

(51) Int. Cl.
*H01L 21/336* (2006.01)

(52) U.S. Cl. .................... 438/281; 438/18; 257/360; 257/361; 257/E21.177

(58) Field of Classification Search ............... 438/18, 438/281; 257/356, 357, 358, 359, 360, 361, 257/362, 363, E21.177
See application file for complete search history.

(56) References Cited

U.S. PATENT DOCUMENTS

| | | | |
|---|---|---|---|
| 5,869,877 | A | 2/1999 | Patrick et al. |
| 6,417,544 | B1 | 7/2002 | Jun et al. |
| 6,586,765 | B2 | 7/2003 | Lin et al. |
| 6,614,051 | B1 | 9/2003 | Ma |
| 6,897,110 | B1 | 5/2005 | He et al. |
| 2002/0142526 | A1 | 10/2002 | Khare et al. |
| 2003/0006412 | A1 | 1/2003 | Martin et al. |
| 2003/0122190 | A1 | 7/2003 | Gallia et al. |
| 2005/0098799 | A1 | 5/2005 | Bonges, III et al. |
| 2006/0022274 | A1 | 2/2006 | Hasegawa et al. |

OTHER PUBLICATIONS

Final Office Action—U.S. Appl. 11/275,482—Dated Jun. 11, 2008.

*Primary Examiner*—Ngan Ngo
(74) *Attorney, Agent, or Firm*—W. Riyon Harding

(57) ABSTRACT

A method for preventing charging damage during manufacturing of an integrated circuit design, having silicon over insulator (SOI) transistors. The method prevents damage from charging during processing to the gate of IC devices by assigning regions to the IC design such that the devices located within the regions have electrically independent nets, identifying devices that may have a voltage differential between the source or drain, and gate as susceptible devices within a given region, and connecting a element across the respective source or drain, and the gate of each of the susceptible devices such that the element is positioned within the region. The method includes connecting compensating conductors to an element to eliminate potential charging damage.

8 Claims, 3 Drawing Sheets

METHOD OF ASSESSING POTENTIAL FOR CHARGING DAMAGE IN INTEGRATED CIRCUIT DESIGNS AND STRUCTURES FOR PREVENTING CHARGING DAMAGE

CROSS REFERENCE TO RELATED APPLICATIONS

The present application is a divisional of U.S. patent application Ser. No. 11/275,482 filed Jan. 9, 2006, which is a continuation in part of pending U.S. patent application Ser. No. 11/003,988 filed Dec. 4, 2004, now U.S. Pat. No. 7,132,318 which is a divisional of U.S. patent application Ser. No. 10/605,888 filed on Nov. 4, 2003 now U.S. Pat. No. 7,067,886. All of the applications described herein are assigned to a common assignee.

BACKGROUND OF INVENTION

1. Field of the Invention

The present invention generally relates to protection circuitry and more particularly to a method and structure that includes a local charge-eliminating element between the source/drain and gate of SOI transistors which may develop a voltage differential between the source/drain and gate during wafer fabrication. The proximate element eliminates the potential for charging damage from energetic processing steps.

2. Description of Related Art

One problem that exists when designing integrated circuits with silicon-over-insulator (SOI) transistors relates to the detection of which SOI transistors may be susceptible to charging damage, and to providing protection once such a susceptible device is identified. In SOI it is not possible to "tie down" a floating gate in the traditional sense, such as by adding a diode connection to the substrate or nwell. SOI technologies are inherently less susceptible to charging damage because both the source/drain and the gate tend to have similar antennae, so the potential of both nodes varies together. This is not, however, certain in all cases. The introduction of a charge-eliminating device or compensating antennas has been shown to reduce the propensity for damage; however this approach is not always sufficient. If the connection between the source/drain and the gate nodes is too remote from the susceptible transistor, and the antennas connected to the source/drain and the gate of the transistor are too large, even a metallic shorting element may be not be of sufficiently low impedance to protect the transistor against damage.

SUMMARY OF INVENTION

The invention described herein detects and modifies the integrated circuit design to eliminate the possibility of charging damage. The invention prevents charging damage for very large antennas and/or severe charging during processing, by providing a charge-eliminating element, for example, a nearby shunt transistor, or wire. The invention also provides a method of altering an integrated circuit design to prevent damage from a potential difference between the source/drain and gate of devices (e.g. transistors) by defining a region within the design to analyze such that devices within the region each have electrically independent nets, tracing the electrically independent nets, identifying devices that may have a voltage differential between the source/drain and gate as susceptible devices (based on tracing the nets), and connecting a local charge-eliminating element, such as a shunt transistor or metallic element, across the source/drain and the gate of each of the susceptible devices such that the charge-eliminating element lies within the defined region.

The integrated circuit is sectioned into multiple parts or regions and each region is individually examined and treated for potentially susceptible devices. Devices whose source/drain and gate are connected together at a location physically remote from the device are identified as potentially susceptible to damage.

The local element eliminates the potential for charging damage to the gate of each of the potentially susceptible devices. The tracing process is performed assuming all metals and diffusions are conductive. The process is performed on each of the regions of the chip design one at a time until the entire chip has been analyzed. The subsets are chosen such that the gate and source/drain nodes are independent, even if they are connected together at a location outside of the specific region under examination. The tracing, identifying, and connecting processes are repeated at each level of wiring within the integrated circuit design.

To assess the susceptibility of a device to charging damage, the invention compares aspect ratios of vias connected to the source/drain and the gate of each of the devices. Alternatively, the invention compares chip locations of conductors connected to the source/drain and the gate of each of the devices. The invention also compares parasitic capacitances of conductors connected to the source/drain and gate of each of the devices and further determines the size of the antennas.

The foregoing process produces a protection circuit for an integrated circuit that includes susceptible devices and has a charge-eliminating element connected from the source/drain to the gate of at least one of the susceptible devices. Furthermore, the charge-eliminating element is located proximate to the susceptible device, whether or not it performs any function other than eliminating the potential for charging damage.

The element is positioned in parallel with the susceptible device. Thus, the element can be positioned between a first conductor connected to the source/drain of the susceptible device and a second conductor connected to the gate of the second susceptible device.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
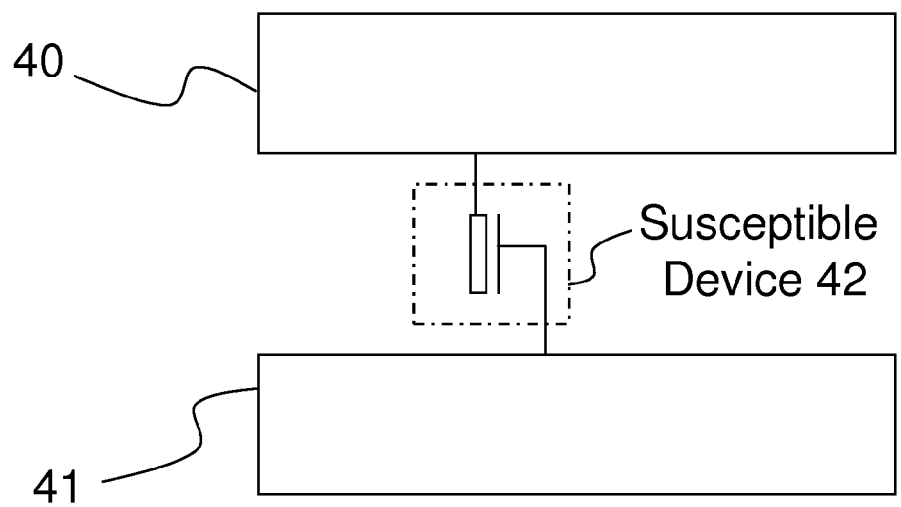
FIG. 1 is a schematic diagram of a circuit device.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

To facilitate clarity, the invention will be described using a silicon on insulator (SOI) circuit example. In the foregoing example, certain IC design structures, such as SOI transistors, produce the possibility of charging damage. For example, it is possible to create a differential antenna by the arrangement of vias within the metal line. Vias placed in narrow metal lines have a larger aspect ratio than vias placed well within large metal plates, and may therefore charge to a different potential when exposed to a plasma. This occurs in either via-first or trough-first processes, although the specific sensitive process then varies. If the gate and source/drain have different via/metal configurations, then charging damage can occur. Elements connecting the source/drain node and the gate node together, either a metallic short, or a diode-connected FET, reduces the propensity of damage. However, in extreme cases this may not be sufficient if the protecting element is located too distant from the device to be protected.

To address this problem, the invention segments the chip design into multiple regions prior to tracing the electrical nets, and determines the characteristics of the charge-collecting antennas on each node of each FET. Where appropriate, a charge-eliminating element is placed locally to eliminate the potential for charging damage.

More specifically, the regions are formed such that the gate and source/drain are independent nets within that region, even if they are shorted together elsewhere in the complete design. If the two nodes exist on the same net (assuming conductive FETs) within the region, then the device is not considered to be subject to damage. The potential for charging damage is assessed by considering the magnitude of the differential between the antennas on the two nodes. If the possibility of damage is considered to be too large, then a charge-eliminating element is inserted from gate to source/drain.

During processing, the ultimate circuit configuration is not complete, so at each level of wiring (M1, M2, etc.) the charging situation is reassessed. The total number of nodes to be examined reduces as higher levels of wiring are considered, until there is effectively only one single node at the final wiring level. Various degrees of refinement are possible, depending on the specifics of the particular technology. For example, the damage may be observed to occur only on devices of a particular type, and in a particular configuration. One such example is that "thick"(>2 nm) pFETs with high-aspect ratio vias on the gate node may be the only susceptible configuration, and all others may be safely ignored.

A method of the present invention prevents damage from current flow between the source/drain and gate of SOI transistors by tracing electrical nets in a predetermined region of the integrated circuit design wherein the nets are electrically independent within the region, identifying SOI transistors that may have a voltage differential between the source/drain and gate as potentially damaged SOI transistors (based on the tracing of the electrical nets), and connecting a charge-eliminating element to one of the source/drain and the gate of each of the potentially damaged SOI transistors within the specified region. As mentioned above, the tracing process is performed assuming all metals and diffusions are conductive. Furthermore, the tracing, identifying, and connecting processes are repeated at each level of wiring within the integrated circuit design. The regions are created such that the total area enclosed within the regions encompasses the entire chip design at least once.

The invention implements a number of different processes to determine whether a voltage differential exists between the source/drain and gate of each SOI transistor. For example, the invention compares aspect ratios of vias connected to the source/drain and gate of each of the SOI transistors to determine whether a voltage differential exists between the source/drain and gate. The method compares the conductive shapes which are connected to the gate and source/drain to identify shapes with large charge accumulation properties (e.g. antennae). This can be accomplished using any conventional shapes processing program. Therefore, the invention obtains the length, width, height, etc. dimensions of the various conductors from the conventional shapes processing program and uses that data to perform the shapes comparison. For example, a via embedded in a long thin metal wire will have different antenna characteristics than a via within a wide plate. If the shapes are not balanced, the charge accumulation is likely to be unbalanced.

In addition, the invention compares chip locations of conductors connected to the source/drain and gate of each of the SOI transistors to determine whether a voltage differential exists between the source/drain and gate. the location, direction, length, etc. of the conductors connected to the gate and to the source/drain are compared using any conventional integrated circuit model program to determine whether their respective positions within the chip (or circuit) would cause a voltage differential. Furthermore, the invention considers the proximity of other conductive lines when determining voltage differentials. For example, for analysis purposes, conductive lines that lie within a predetermined proximity (and/or that carry a predetermined voltage level) leak a certain predetermined percentage of the voltage to the conductor under evaluation. Also, the invention compares parasitic capacitances of conductors connected to the source/drain and the gate of each of the SOI transistors to determine whether a voltage differential exists between the source/drain and gate. Thus, the invention uses any conventional parasitic capacitance calculator to determine the parasitic capacitance of a conductor connected to the gate and compares this parasitic capacitance to a conductor which is coupled to the source/drain.

For example, FIG. 1 illustrates a device 42, which is potentially susceptible to charging damage. Device 42 may be, for example, a transistor, which has its gate connected to a large antenna 41 and its source/drain connected to a large antenna 40. As mentioned above, the invention identifies device 42 as having the potential to be damaged because charge accumulation on antenna 41 may be substantially different than the charge accumulation on antenna 40. The physical separation of the two antennas means that each may possess a different potential, due to lateral nonuniformities.

Figure 2:
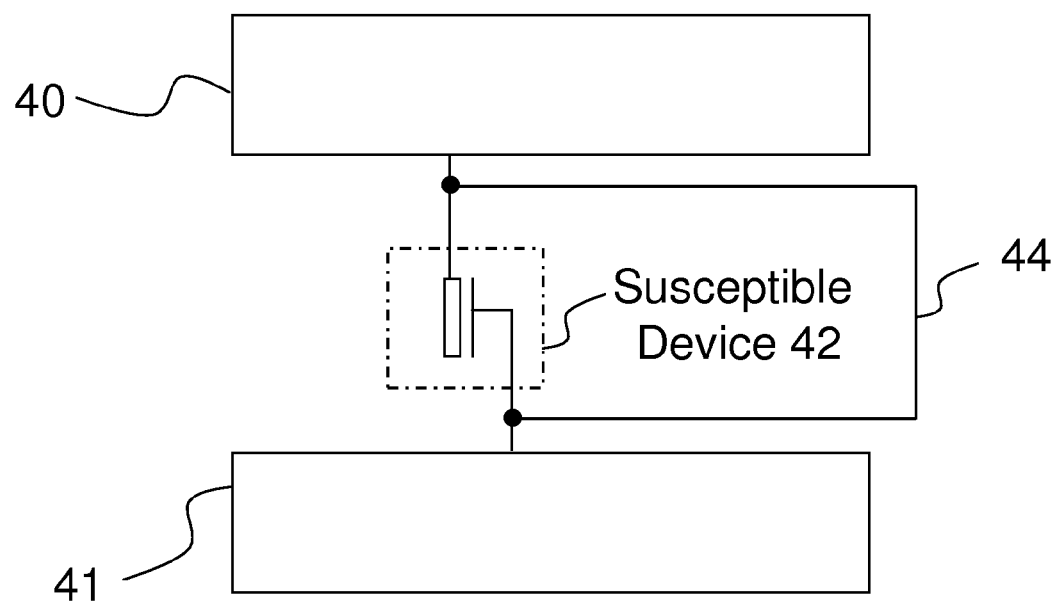
FIG. 2 is a schematic diagram of a circuit device with a charge-eliminating element.

FIG. 2 shows an example where the two large antennas 40 and 41 are connected together by an element 44 (e.g. a charge-eliminating element). Element 44 is physically remote from the susceptible device 42. Based on current methods, device 42 in FIG. 2 would not be considered to be susceptible to charging damage because the transistor gate is logically shorted to the source/drain. However, experimental evidence shows that device 42 is still susceptible to charging damage.

Figure 3:
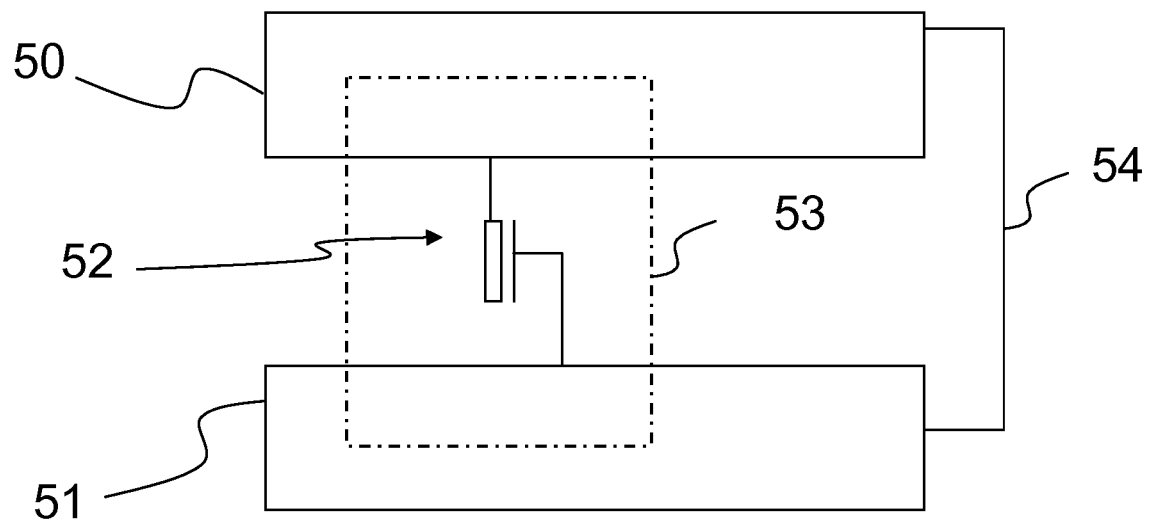
FIG. 3 is a schematic diagram of a circuit device with an alternatively located charge-eliminating element.

FIG. 3 shows how the method described herein identifies a susceptible device 52 as having a propensity to damage as shown by large antenna 50 and large antenna 51. An element 54 has been implemented to reduce the susceptibility of device 52 to charging damage (as described in FIG. 2). A region 53, indicated by the dotted line, schematically represents a subset of the chip design that is individually examined for antenna effects. Region 53 is dimensioned and positioned such that element 54 is found outside of region 53 undergoing examination. In other words, region 53 includes susceptible device 52, such that the nets coupled to device 52 are electrically independent within region 53.

Figure 4:
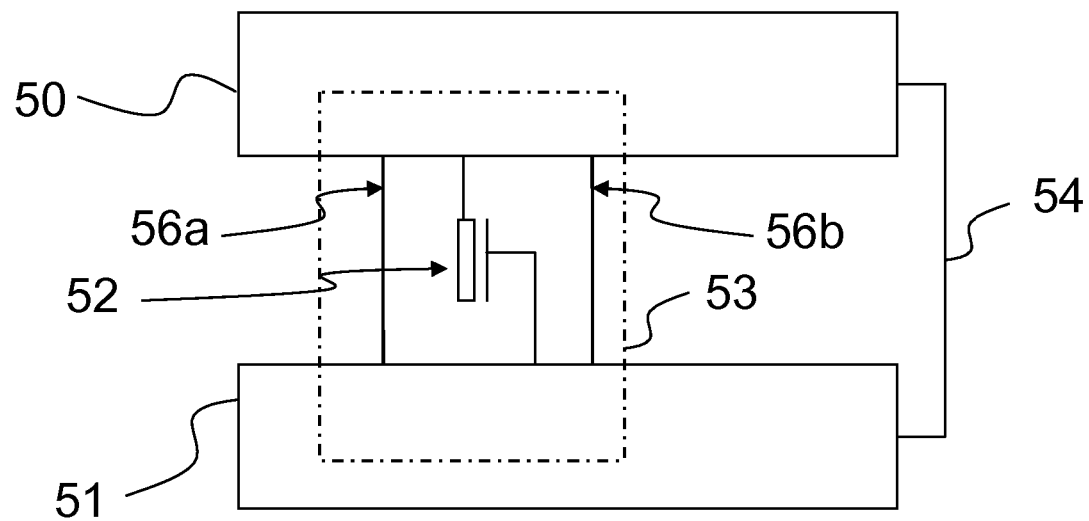
FIG. 4 is a schematic diagram of a circuit device with a local charge-eliminating element and FIG. 5 is a flow diagram illustrating a method of the invention.
Figure 5:
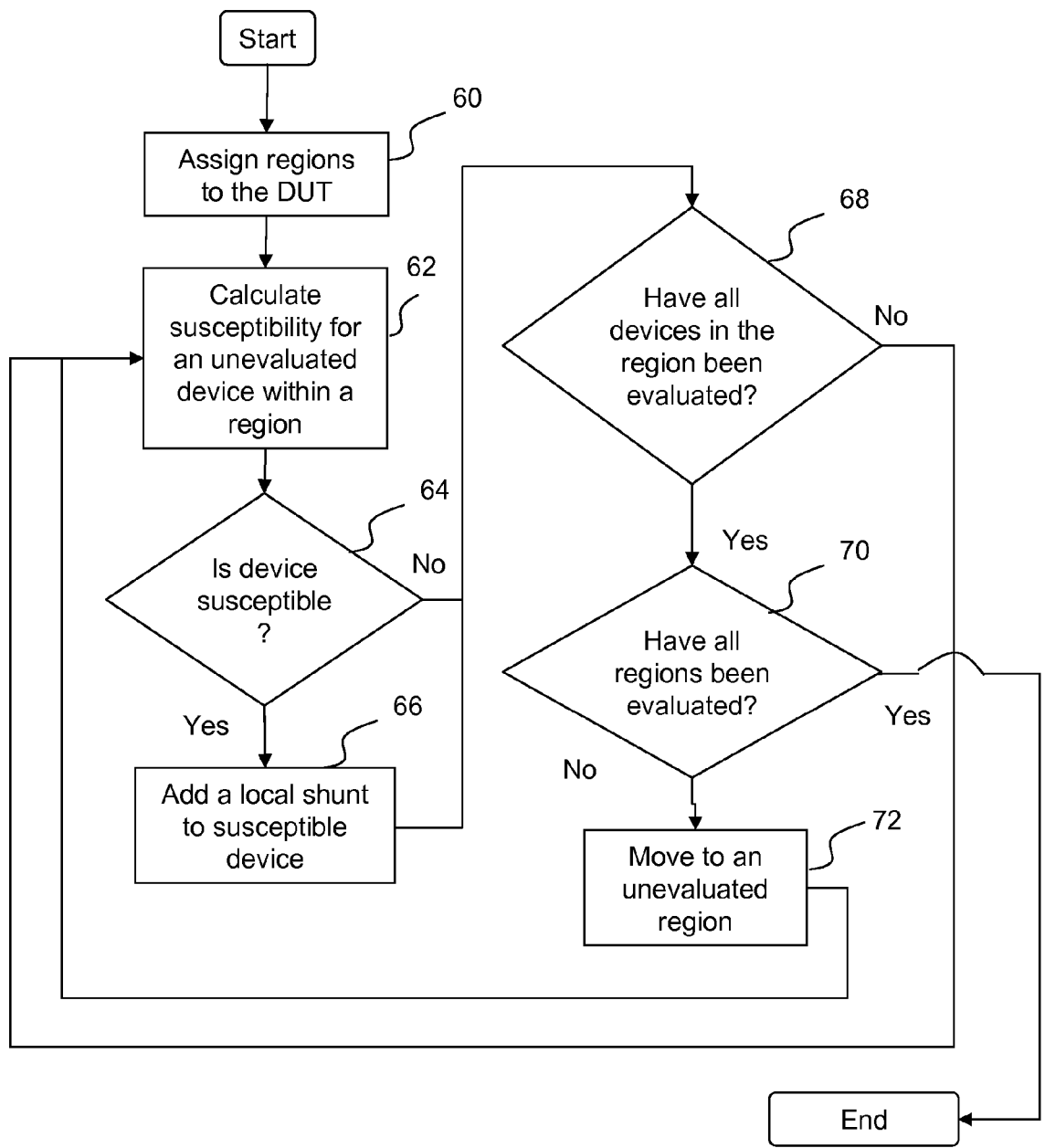

FIG. 4 shows the result of implementing the invention described herein, which is discussed in further detail in FIG. 5. Susceptible device 52 is fully protected from possible charging damage by the introduction of charge-eliminating element 56 located within region 53. Element 56 couples antenna 50 to antenna 51, thus relieving charging damage susceptibility.

FIG. 5 illustrates a flow diagram of a method of identifying susceptible devices and eliminating the risk of charging damage to the identified devices.

In step 60, the method assigns one or more regions to the design under test (DUT). The regions are dimensioned such that the nets coupled to each device are electrically independent.

In step 62, the method calculates the susceptibility for an unevaluated device within its region. The susceptibility is calculated by determining the size, location, and characteristics of the antennas (wiring and vias) attached to each node of each transistor. For example, the total area of all vias at each specified level are summed; this is done for each node of the transistor. If the total area on each node exceeds a predetermined value then the transistor is determined to be susceptible. Similarly, the total area of metal wiring found at each level connected to each node is determined, and compared against a given threshold to determine susceptibility.

In step 64 the method determines whether the device is susceptible; if yes, the method proceeds to step 66, if no, the method proceeds to step 68.

In step 66, the method adds a charge-eliminating element to the design layout near the identified susceptible device, such that the element couples two potential antennas within the current region under evaluation. The method proceeds to step 68.

In step 68, the method determines whether all the devices in the region have been evaluated; if yes, the method proceeds to step 70, if no, the method returns to step 62.

In step 70, the method determines whether all regions within the design (or some predetermined portion thereof) have been evaluated; if yes, the method ends, if no, the method proceeds to step 72.

In step 72, the method chooses a new (unevaluated) region with which to perform the susceptibility calculation and returns to step 62.

While the invention has been described in terms of preferred embodiments, those skilled in the art will recognize that the invention can be practiced with modification within the spirit and scope of the appended claims.

The invention claimed is:

1. A method of preventing charging damage in an integrated circuit comprising the steps of:
   assigning a region to an integrated circuit design, wherein the region comprises at least one device having electrically independent nets;
   identifying a device within the region that has a voltage differential between the source or drain, and gate as a susceptible device; the susceptible device is susceptible to charging damage during processing; and
   connecting an element to one of said source or drain, and said gate of the susceptible device, wherein said element is located within said region to eliminate the potential for charging damage, and said element is a wire.

2. The method in claim 1, wherein said identifying process comprises comparing aspect ratios of a plurality of vias connected to said source or drain, and said gate of each of said susceptible devices to determine whether a voltage differential may exist between said source or drain, and said gate.

3. The method in claim 1, wherein said identifying process comprises comparing chip locations of conductors connected to said source or drain, and said gate of each of said susceptible devices to determine whether a voltage differential may exist between said source or drain, and said gate.

4. The method in claim 1, wherein said identifying process comprises comparing parasitic capacitances of conductors connected to said source or drain, and said gate of each of said susceptible devices to determine whether a voltage differential may exist between said source or drain, and said gate.

5. A method of preventing charging damage in an integrated circuit comprising the steps of:
   assigning a region to an integrated circuit design, wherein the region comprises at least one device having electrically independent nets;
   identifying susceptible devices within a region that have a voltage differential between the source or drain, and gate as susceptible devices;
   connecting an element to one of said source or drain, and said gate of each of said susceptible devices such that said element is located within said region, and said element is a wire; and
   connecting a compensating conductor to said element wherein said compensating conductor is located within said region, and wherein said element and said compensating conductor eliminate the potential for charging damage between said source or drain, and said gate of each of said susceptible devices, during processing.

6. The method in claim 5, wherein said identifying process comprises comparing aspect ratios of a plurality of vias connected to said source or drain, and said gate of each of said susceptible devices to determine whether a voltage differential may exist between said source or drain, and said gate.

7. The method in claim 5, wherein said identifying process comprises comparing chip locations of conductors connected to said source or drain, and said gate of each of said susceptible devices to determine whether a voltage differential may exist between said source or drain, and said gate.

8. The method in claim 5, wherein said identifying process comprises comparing parasitic capacitances of conductors connected to said source or drain, and said gate of each of said susceptible devices to determine whether a voltage differential may exist between said source or drain, and said gate.

* * * * *